United States Patent [19]

Lamarre

[11] Patent Number: 5,296,333
[45] Date of Patent: Mar. 22, 1994

[54] PHOTORESIST ADHESION PROMOTER

[75] Inventor: Philip A. Lamarre, Waltham, Mass.

[73] Assignee: Raytheon Company, Lexington, Mass.

[21] Appl. No.: 850,218

[22] Filed: Mar. 12, 1992

Related U.S. Application Data

[63] Continuation of Ser. No. 615,937, Nov. 16, 1990, abandoned.

[51] Int. Cl.$^5$ ................................................ G03C 1/76
[52] U.S. Cl. ...................................... 430/271; 430/954
[58] Field of Search ............... 430/311, 319, 327, 330, 430/331, 954, 271

[56] References Cited

U.S. PATENT DOCUMENTS 4,409,319 10/1983 Colacino et al. .................... 430/317
4,970,134 11/1990 Bronstert et al. .................... 430/954

Primary Examiner—Marion E. McCamish
Assistant Examiner—Kathleen Duda
Attorney, Agent, or Firm—R. Sharkansky

[57] ABSTRACT

A positive photoresist adhesion promoter which is provided as a thin layer between a resist such as polymethylmethacrylate for use on gallium arsenide is described. The positive photoresist adhesion promoter includes a mixture of a positive photoresist with an organic solvent. The use of the positive adhesion promoter increases the resistance of the resist such as PMMA to chemical stress during subsequent processing steps for the circuit. An alternative arrangement is to use a composition of the photoresist to be deposited as the masking layer as adhesion promoter layer and processing the adhesion promoter layer to induce cross linking in the resin component of the photoresist material to thus provide a tenacious bond between the adhesion promoter layer and the material of the substrate, such as gallium arsenide.

7 Claims, 3 Drawing Sheets

PHOTORESIST ADHESION PROMOTER

This application is a continuation of application Ser. No. 615,937 filed Nov. 16, 1990 now abandoned.

BACKGROUND OF THE INVENTION

This invention relates generally to semiconductor fabrication techniques and, more particularly, to masking techniques.

As it is known in the art, a semiconductor circuit is fabricated by using sequences of semiconductor growth, etching, metalization, and patterning steps, which are used in various combinations to form the desired semiconductor circuit or integrated circuit. One of the most commonly used steps in semiconductor fabrication process are masking steps. Generally the masking steps include the use of a resist which is patterned either by projecting a desired image through a mask onto the resist layer or disposing a mask on the resist layer and imaging through the mask. The image is used to selectively sensitize regions of the resist material.

Resists generally are of several types. The first classification for a resist is the classification pertaining to the portion of the electromagnetic spectrum used to sensitize the resist. In general, resists are a three component system. The first component is a resin, such as a phenolic resin which forms a matrix when deposited and a chemical activator which is sensitive to particular electromagnetic energy and a solvent in which the other two materials are dissolved. The solvent is generally driven off prior to imaging the resist and is used as a vehicle to apply the solids in the resist to the surface to be masked. Resists are available which are sensitive to various bands of electromagnetic energy including resists sensitive to exray energy, electron beams, as well as photons of optical energy in the UV, as well as, optical portions of the electromagnetic spectrum. A principal factor used in selecting a resist is the degree of resolution required for the formed photoresist pattern.

The second classification for a resist are resists which are positive resists and resists which are negative resists. A positive resist is a resist having a positive electromagnetic energy activator which when exposed to such energy undergoes a chemical change with the resin matrix material providing an exposed resist region which can be washed away in a developing process by use of a suitable developer. On the other hand, a negative photoresist undergoes the exact opposite transformation, that is, providing an activator chemical which undergoes a chemical transition causing the exposed portion of the resist to be inert to the developing chemical.

Other types of resists such as polymethylmethacrylate develop a latent image through fissioning of polymer chains as a result of incident high energy electron beams or energetic photons.

Within each photoresist type particularly positive photoresist which are activated by electron beams or optical photons (i.e. either deep UV or UV), there are many different commercially available photoresists. The particular photoresists chosen is chosen for various properties including its degree of adhesion to materials over which they are disposed, its chemical and thermal resistance to solvents used during other portions of a semiconductor fabrication process and as mentioned above its optical imaging characteristics. Thus, while each of the aforementioned properties of resist are important, a particular semiconductor fabrication step may dictate the importance of one property over another. Often, a resist chosen for imaging qualities has concomitantly poor adhesion properties, particularly on semiconductor materials.

As an illustrative example of the aforementioned problem, a photoresist generally denoted as PMMA (polymethylmethacrylate) is commonly used on gallium arsenide for providing patterns having a high degree of resolution, as for example, the patterns which are commonly used during steps of forming gate electrodes for field effect transistors fabricated on the gallium arsenide. PMMA is a popular resist patterning material for submicron gates on gallium arsenide wafers because of its excellent optical imaging properties. However, as described in a paper entitled "Gallium Arsenide Process Compatibility Adhesion for PMMA Resists" by Levinson, et al., Electro Chemical Society, Solid State Science and Technology, Vol. 133, No. 3 (1986), page 619, PMMA is prone to undercutting and adhesion failure particularly during wet chemical etching processes.

Proper adhesion of the PMMA resist to the gallium arsenide is a critical requirement since adhesion failure will cause a failure in the etching step. In a typical process fabrication flow for such devices, the gate deposition step is one of the final steps in the processing of a wafer including such semiconductor devices. Failure at that juncture is extremely costly and troublesome. One solution suggested for this problem is an adhesion promoter referred to as hexamethyldisilazane. This material is an adhesion promoter for silicon and surfaces containing silicon. The promoter acts to form a siloxane bond with the silicon containing surface. However, it has been reported in "Gallium Arsenide Processing Techniques" by Williams, et al., Art Tech House, Inc. (1984), p. 137, that hexamethyldisilazane is not an effective adhesion promoter without the formation of siloxane bonds. Therefore, hexamethyldisilazane is probably not an effective promoter for use with gallium arsenide since such siloxane bonds will not form.

Another approach to this problem has been to bake (i.e. cure) the deposited resist at an elevated temperature over an extended period of time than otherwise used. While this has some effect in increasing adhesion promotion, it also has the drawback of reducing the ability of a developer to remove exposed portions of the resist. This occurs because the extended baking of the phenolic resin causes the resin to undergo a chemical reaction. That is, the resin material which is in the form of a long chain polymer undergoes cross linking polymerization. This is very undesirable for effective removable of exposed portions of the photoresist since cross linking increasing the integrity and the resistance of the material to removal during developing of the resist. This is undesirable for providing patterns having good resolution.

SUMMARY OF THE INVENTION

In accordance with the present invention, a method of depositing a layer of resist comprises the steps of depositing a thin layer of an adhesion promoter solution comprising a resin vehicle and a solvent, said solution having a solids content substantially less than 0.21 grams per liter; curing said adhesion promoter layer; and depositing a layer of resist over the adhesion promoter layer. With such an arrangement, an adhesion promoter layer is provided between a deposited resist layer and a substrate. In a first embodiment of the adhesion promoter, the resin vehicle is the same resin vehicle as used in the layer of resist deposited over the promoter layer. The initial thin layer of adhesion promoter is cured at a temperature for a period of time to cause the resin vehicle to cross link thereby providing the adhesion promoter with a tenacious bond to the substrate over this adhesion promoter layer is deposited the layer of resist. Since the promoter layer is relatively thin, the cross linking of the resin does not substantially effect subsequent developing and processing of the resist disposed thereover. In an alternate embodiment, the resin of the adhesion promoter is from a resist having a high degree of adhesion to the substrate material over which it is deposited. The high degree of adhesion property of the selected material may be selected without consideration being given to the optical properties of the resist since in the thickness deposited it will not substantially effect the imaging quality of the resist pattern disposed thereover.

In accordance with a further aspect of the present invention, a photoresist adhesion promoter comprises a photoresist in solution with a solvent having a solid content substantially less than 0.21 grams per liter of fluid. With such an arrangement, a photoresist adhesion promoter having a very low solids content is disposed in very thin layers (i.e. on the order of tens of angstroms) over a surface to be coated with a resist layer. Thus, by appropriate choice and processing of the deposited solid, a film is provided having a high degree of adhesion to the surface over which it is deposited. Further, such an adhesion promoter will have a likewise high degree of adhesion to a resist layer which is used to provide the masking layer since the resist layer is of a similar chemical nature as the adhesion promoter.

BRIEF DESCRIPTION OF THE DRAWINGS

The foregoing features of this invention, as well as the invention itself, may be more fully understood from the following detailed description of the drawings, in which.

DESCRIPTION OF THE PREFERRED EMBODIMENTS

Referring now to FIGS. 1–5, steps in the fabrication of here a metal semiconductor field effect transistor, in particularly the gate electrode portion thereof using an adhesion promoter for layer to increase the bond tenacity between a masking layer and a semiconductor material will now be described.

Figure 1:
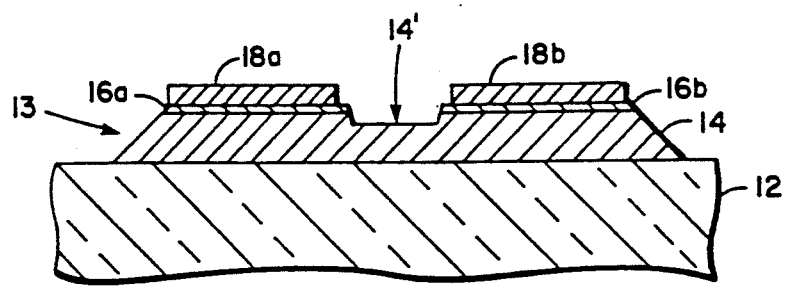
FIG. 1 is a cross-sectional view showing a metal semiconductor field effect transistor prior to deposition of a gate electrode.

Referring first to FIG. 1, a substrate 12 here comprised of semi-insulating gallium arsenide is shown to be supporting a mesa 13 having an active layer 14 comprised of N-type gallium arsenide with a typical dopant concentration of generally greater than $1 \times 10^{16}$ atoms/cc up to about $5 \times 10^{17}$ atoms/cc and having disposed thereover contact layers 16a, 16b of more heavily N-type doped gallium arsenide having a typical dopant concentration of generally greater than $1 \times 10^{18}$ atoms/cc The active layer 14 further has a recessed portion 14', as shown. Disposed over contact layer 16a, 16b are source electrode 18a and drain electrode 18b, respectively as shown. Here source electrode 18a and drain electrode 18b are alloyed with underlining contact layer 16a, 16b to provide low resistivity ohmic type contacts thereto as generally known in the art.

The foregoing thus describes a metal semiconductor field effect transistor having source and drain electrodes and at such a juncture at which a gate electrode is to be formed in the recessed portion 14' of active layer 14 in a manner as now will be described. Substrate 12, and in particular, regions 14' of active layer 14 are cleaned, freed from contamination, residues, or absorbed molecular water using standard surface preparation techniques. For example, one standard surface preparation technique includes cleaning the surface with a solvent such as acetone or N-methyl pyrrolidone followed by an oxygen plasma descum, as will be described, and then washing the descummed surface with ammonia as by spinning ammonia onto the surface.

Figure 2:
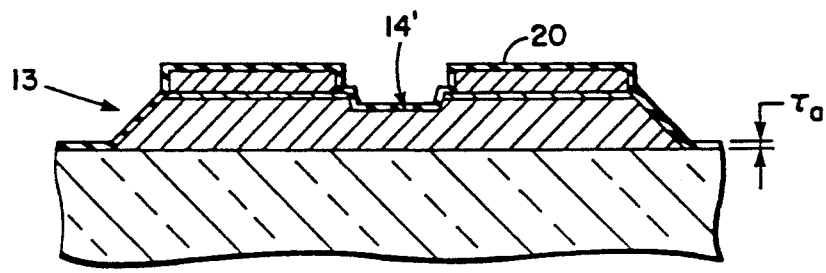
FIG. 2 is a cross-sectional view of the device shown in FIG. 1 having a adhesion promoter layer disposed thereover.
Figure 6:
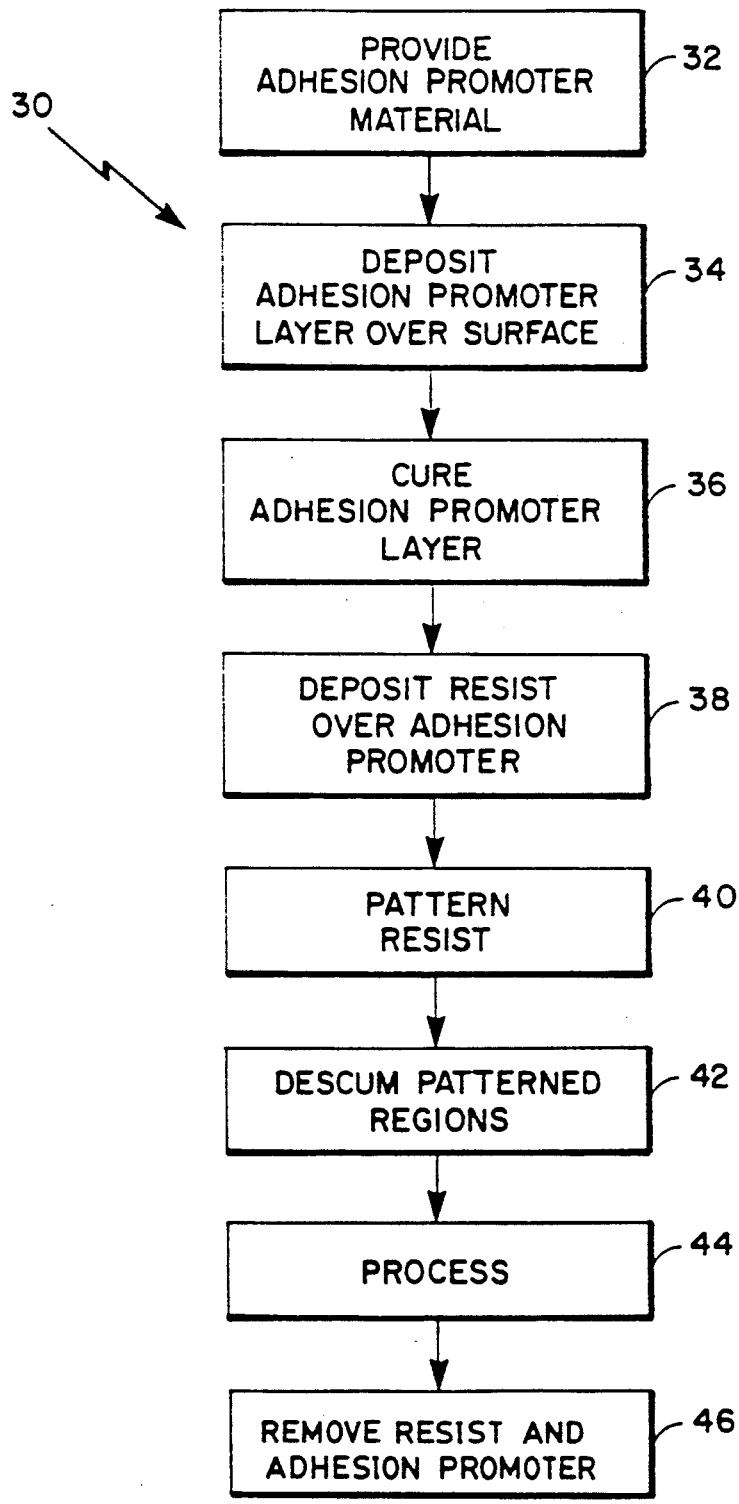
FIG. 6 is a flow diagram showing the steps in manufacturing and using the adhesion promoter layer.

Referring now to FIG. 2, an adhesion promoter layer 20 is shown disposed over substrate 12, mesa 13, and in particular, recessed active layer portion 14', as shown. Here, the adhesion promoter layer is an extremely thin layer of a suitable adhesion promoter material as will be described below in conjunction with FIG. 6. Suffice it here to say that adhesion promoter layer 20 is deposited to a thickness of generally more than 10Å and up to about 100–150Å with a preferred thickness ($\tau_a$) in the range of 30–60Å. The adhesion promoter layer, as will be further described in conjunction with FIG. 6, provides a tenacious bonding surface between a photoresist layer, as will be described in conjunction with FIG. 3 and the surfaces of the substrate 12 which are to be masked by the photoresist layer. In general, the adhesion promoter layer is used to promote the adhesion of resist types which have poor adhesion characteristics to the substrate material over which they are deposited. For example, a commonly used e-beam resist polymethylmethacrylate (PMMA) has generally poor adhesion characteristics to gallium arsenide. However, PMMA has excellent deep ultra-violet imaging features making such resist, in particular, attractive for fine line width imaging such as commonly encountered in providing gate electrode for metal semiconductor field effect transistors.

Gate electrodes patterned with PMMA generally have conductor width dimensions which are commonly referred to as "gate length" on the order of 0.5 microns up to about 2 microns. Even finer line widths are used electron beam imaging with PMMA (i.e. on the order of $0.1\mu$ to $0.5\mu$). Another example of a high resolution resist is i-line resist (sensitive to the i-line in the Hg spectrum corresponding to a wavelength of 365nm). An example of such resist is AZ5209E from Hoechst Company, AZ Photoresist Products Division, Summerville, NJ. Thus, the use of resists having excellent imaging characteristics are necessary for forming the fine features of current semiconductor processes.

However, resists such as PMMA type of resists and the i-line resists often suffer resist failure due to subsequent processing steps such as, for example, etching of exposed surfaces of the gallium arsenide prior to metalization of the gate electrode.

Using PMMA type of resist, a patterned region is provided by directing an electron beam to selected portions of the resist layer. After exposure, the wafers are developed in a solvent such as methylisobutylketone (MIBK) and isopropanol. Following this development, the exposed portions of the PMMA resist which were exposed to the high energy electrons are washed away leaving behind wafers having exposed gallium arsenide. On the exposed gallium arsenide is generally a "scum" which may contain residual PMMA resists, as well as other materials. This "scum" layer is generally removed in a plasma etch and the exposed surface is then cleaned by using an ammonium hydroxide, for example, to remove any surface oxides which may have formed as mentioned above. Generally, the latter three steps, the developing step, and, in particular, the plasma descum step, and, in particular, the surface oxide removal step often attack the integrity of the remaining photoresist pattern. Often, the resist pattern may often peel away from the gallium arsenide substrate. Such an occurrence results in resist failure which generally requires halting the fabrication of circuits on the particular wafer effected. This problem increases manufacturing costs and reduces yield of completed devices since often the wafer cannot be reworked and must be scraped.

Returning to a discussion of FIG. 2, the adhesion promoter layer 20 is shown disposed over the substrate 12 and the mesa region 13, and in particularly is shown disposed in contact with the recessed active layer portion 14'. Although the use of the adhesion promoter layer is particularly described in conjunction with the formation of the gate electrode, as will be discussed is conjunction with FIG. 3-5. It should be understood that the adhesion promoter layer can be used during any photoresist processing step where adhesion may be a problem.

Figure 3:
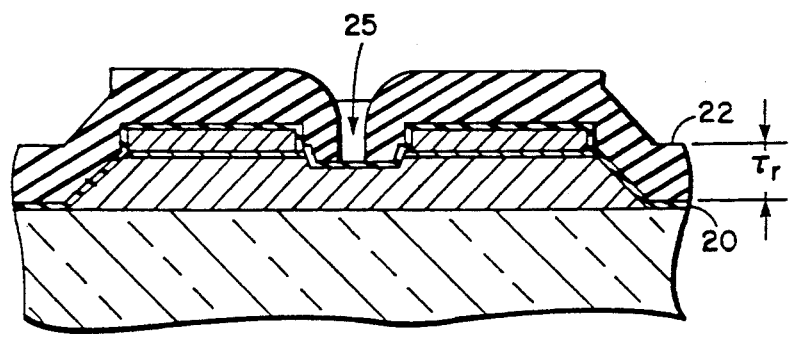
FIG. 3 is a cross-sectional view showing the adhesion promoter layer activated and having disposed thereover a layer of a photoresist with a pattern to provide a region to form a gate electrode.

Referring now to FIG. 3, a photoresist layer 22 is shown disposed over the adhesion promoter layer 20. In general, the photoresist layer 22 has a thickness substantially larger than the thickness of the adhesion promoter layer 20. As for example, a typical thickness $\tau_r$ for the photoresist layer 22 would be greater than 0.5 micron, for example, whereas the adhesion promoter layer would have a thickness $\tau_a$ typically of 60Å. The photoresist layer 22 is shown patterned to provide an aperture 25 which exposes underlying portions of the recessed active layer 14' using conventional exposure and development techniques for the particular pattern and resist layer combination used. For example, if layer 22 is polymethylmethacrylate (PMMA), a standard technique would be to expose portion of the electron resist layer 22 (PMMA) through which gate electrodes are to be provided with high energy (e.g. 20 KeV) electrons.

After the exposure, the wafers are developed in a standard developer for the material of electron resist layer 22. Thus, assuming resist layer 22 is PMMA, one development system would include a mixture of methylisobutylketone and isopropanol. This would remove the layer 22, as shown. A preferred technique for removing any residual material left behind from developing is a plasma descum which here includes exposing aperture 25 and the undeveloped resist 22 to an oxygen plasma for a predetermined period of time sufficient to oxidize or "ash" the material in aperture 25 and thus remove any residual material. For example, a typical plasma descum would involve subjecting the material to a oxygen plasma at a flow of 100 SCCM, at a power level of 800 watts in a vacuum of 3 torr for a period of 60 seconds. In the oxygen plasma, the oxygen attacks any residual material on the semiconductor surface causing the layer to oxidize and to be removed.

Figure 4:
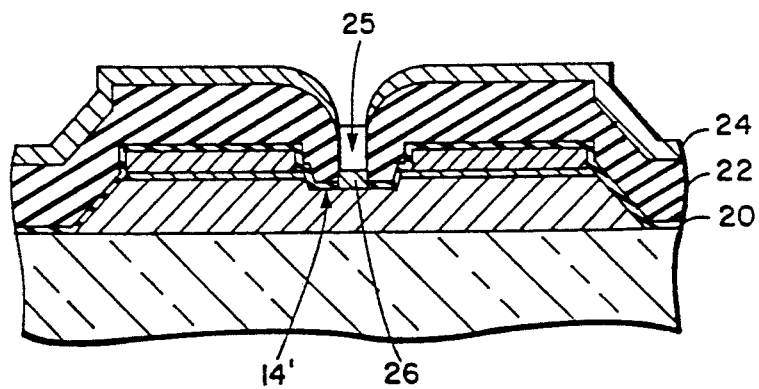
FIG. 4 is a cross-sectional view of a field effect transistor having a gate electrode disposed in the pattern provided in the photoresist layer.

Still referring to FIG. 4, a layer of a Schottky barrier forming metal 24 is shown disposed over photoresist layer 22 and within the pattern 25 provided within photoresist layer 22, thus providing a gate electrode 26 in Schottky barrier contact with the recessed active layer portion 14'.

After the gate electrode 26 is provided in the patterned region, the photoresist layer 22 and metal layer 24 are "lifted off" using conventional techniques. The adhesion promoter layer 20 is also removed during this step. The resist 22, adhesion photoresist layer 20, and portions of metal layer 24 disposed over photoresist layer 22 are removed by soaking substrate 12 in a solvent solution suitable for the particular resist used as, for example, acetone or N-methylpyrrolidone. After adhesion promoter layer 20, photoresist layer 22, and metal layer 24 are removed, any remaining portions thereof are removed by using the oxygen plasma descum technique referred to above. After removal of any remaining traces particularly of the adhesion promoter layer 20, the substrate is washed in ammonia to remove any surface oxides which may have formed during the $O_2$ plasma descum.

Figure 5:
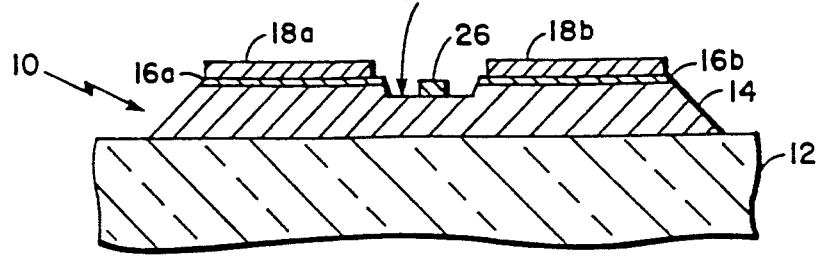
FIG. 5 is a cross-sectional view showing a completed metal semiconductor field effect transistor having the gate electrode.

Thereafter, a metal semiconductor field effect transistor 10 is provided, as generally shown in conjunction with FIG. 5 having gate electrode 26 disposed in Schottky barrier contact with a recessed portion 14' of active layer 14 and having source and drain electrode 18a, 18b, respectively disposed in ohmic contact with contact layer 16a, 16b, respectively as shown.

Referring now to FIG. 6, steps 32-48 in a process 30 for providing an adhesion promoter layer over a surface will now be described in conjunction with the flow chart 30.

The first step 32 in the process is to provide the adhesion promoter material. In general, since the adhesion promoter material must provide a tenacious bond between the surface over which it is deposited and a photoresist layer to be deposited thereover, the choice of the particular adhesion promoter material should be based principally upon its adhesion characteristics. One technique which is used therefore is to provide an adhesion promoter layer comprised of a photoresist or resist material which has extremely good adhesion properties to the surface over which it is to be deposited. In this technique, in general, the adhesion promoter layer will be comprised of a photoresist which is different than the photoresist which will be deposited to form the masking layer 22 (FIGS. 3-4). One example for an adhesion promoter layer particularly suitable for a resist such as polymethylmethacrylate (PMMA) is to use a resist such as Shipley (Newton, Mass.) Microdeposit 1400-20 in a mixture with 2-ethoxyethylacetate. In general, the mixture is comprised of 1 part of photoresist including resin and solvent, as supplied from the manufacturer, to approximately 35 parts of solvent. That is an extremely diluted solution of the positive photoresist is provided. In general, photoresist as supplied from a photoresist manufacturer is characterized by its solids content. The present mixture described above provides a solution having a solids content of approximately 0.01 grams solid per liter of fluid and thus it is preferred that the adhesion promoter layer, in general, have a solids content substantially less than 0.2 grams per liter of fluid. A preferred range therefore is 0.001 to 0.02. In general, the solvent used to dilute the photoresist to provide the adhesion promoter is the same solvent which carries the particular resin supplied by the manufacturer of the resist or photoresist. Other types of positive photoresist, for example, which have excellent adhesion properties to the substrate material, such as gallium arsenide, for example, may also be used. The solution of the photoresist would be diluted to provide the adhesion promoter in a similar proportion as that described above for the Microdeposit 1400-20 type resist.

An alternative approach to that described above for providing adhesion promoter material is to provide a diluted solution of the photoresist layer which will be used as the masking layer. A good adhesion promoter material can be provided with this material using the processing to be described below. Again, thus assuming polymethylmethacrylate (PMMA) is the desired photoresist material for layer 22 (FIGS. 3-4) then a diluted solution of PMMA, as from the manufacturer, and chlorobenzene, as the solvent is provided in the same proportion of 1 part PMMA to 35 parts chlorobenzene solvent. Typical solids content for PMMA is 0.05 grams solids per liter of fluid.

Since standard photoresists include a resin material, the resin material may be used to provide a high adhesion promoting material. For example, in PMMA resist processing, the PMMA exposed to deep UV optical energy or high energy electrons in the photoresist cuts up the long chain polymers (sissions). It is known that during standard processing of resist films, as for example, the PMMA type resist, that the resist is baked to an elevated temperature typically in the order of about 180° C. for several minutes. This bake is used principally to drive off the solvent and stabilize the resin.

However, if left exposed to such an elevated temperature for an extended period of time, the resin will cross link, that is, forms cross linking bonds between adjacent long chain polymers providing a material which is difficult to remove. This phenomena while disadvantageous to conventional masking layers is used here to advantage to provide an adhesion promoter, if the adhesion promoter layer is deposited in extremely thin layers, as for example, on the order of tens of angstroms as described above, since the plasma descum step, as described above, a standard part of the process, will be effective in removing such thin layers of cross-linked polymerized photoresist.

Figure 8:
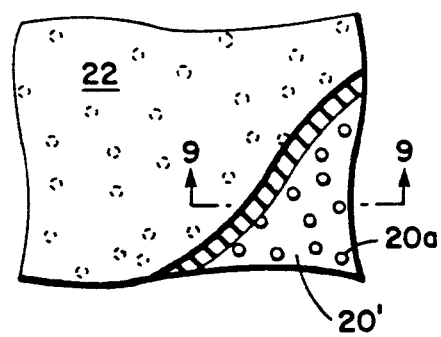
FIG. 8 is a diagrammatical plan view partially torn away of the adhesion promoter layer provided by the arrangement of FIG. 7 and a resist layer.
Figure 9:
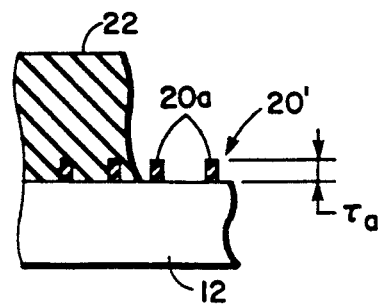
FIG. 9 is a diagrammatical cross sectional view of a typical resist and adhesion promoter layer provided by the alternative technique described in conjunction with FIG. 8.

In either event, either the adhesion promoter material comprising a photoresist having good adhesion qualities to the surface to be masked or an adhesion promoter material comprising the photoresist which is to be deposited as the masking layer is deposited (step 34) in a very thin layer over the surface to be masked. One preferred technique for depositing the adhesion promoter layer is to spin a substrate 12 at a rate of 3,000 rpm and deposit the adhesion promoter solution on the spinning substrate (not shown) to obtain a layer of the adhesion promoter having a nominal thickness of 60Å. An alternative technique will be described in conjunction with FIGS. 7-9.

After the adhesion promoter layer is deposited over the surface, the adhesion promoter layer is cured (step 36). For the first example of the adhesion promoter layer, that is the adhesion promoter layer comprised of a photoresist having good adhesion characteristics to the surface to be masked, the surfaces coated with the adhesion promoter layer are baked for a predetermined period of time at an elevated temperature. For the "Microdeposit" photoresist type the wafers of gallium arsenide are baked for approximately 40 seconds at 100° C. This provides a layer 40 which forms a tenacious bond to the underlying gallium arsenide as well as to the metalized electrodes as generally shown in FIG. 2.

Using the second example of an adhesion promoter layer that is a very diluted solution of the photoresist to be deposited as the masking layer, a thin layer of desired photoresist is likewise baked for a predetermined period of time at an elevated temperature sufficient to induce cross linking of the resin. The period of baking and the elevated temperature are in general higher than that used for the first example of the adhesion promoter layer. A typical process for PMMA therefore would be a baking for one hour at 180° C. By inducing such cross linking in the resin, a tenacious bond is formed between the PMMA and the underlying gallium arsenide material.

After curing of the adhesion promoter layer, a resist is deposited (step 38) over the adhesion promoter layer. Here, an example of a preferred resist is PMMA, although any type of resist such as i-line resist used in i-line beam lithography or other types of resist where better adhesion to the underlying material, such as here gallium arsenide is desired may alternatively be used. The deposited resist layer is patterned (step 40) using conventional techniques for the selected resist. After patterning of the resist layer, regions of said patterned resist are descummed (step 42) using an oxygen plasma etch which removes the relatively thin adhesion promoter layer portions exposed by the patterned resist as generally shown in FIG. 3. The descummed region is then cleaned using any standard technique such as spinning ammonia onto the surface. After descumming and cleaning of the patterned layer, the desired process step 44 is performed as, for example, formation of the gate electrode as described in conjunction with FIG. 4. After the desired process step has been completed, the resist layer and adhesion promoter layer are removed (step 46) using conventional techniques for the chosen resist. For instance, the solvent cleaning the oxygen plasma descum etch and ammonia wash referred to above could be used.

Figure 7:
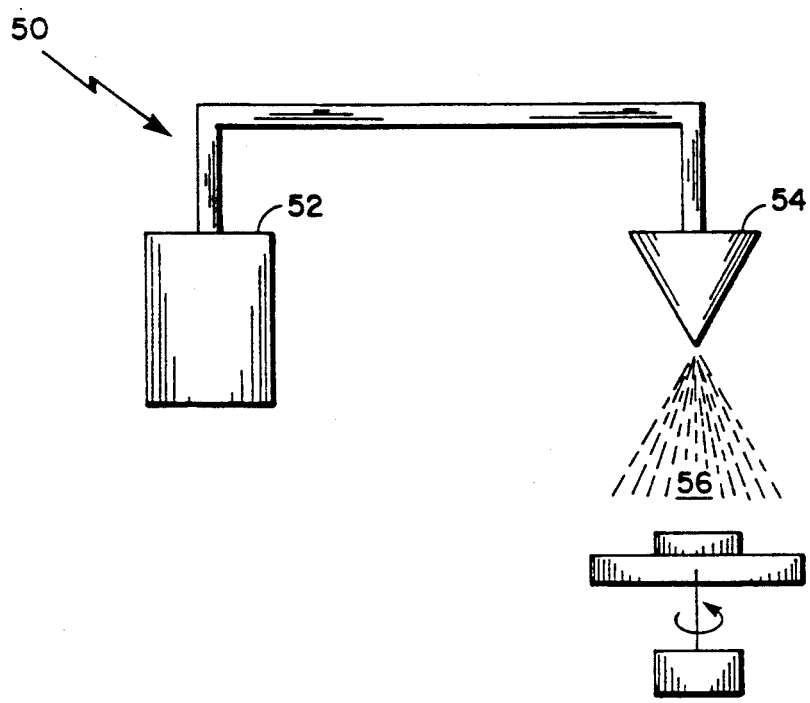
FIG. 7 is a diagrammatical view of an alternate arrangement for providing the adhesion promotor layer.

Referring now to FIG. 7, a diagrammatical view of an alternate arrangement for depositing a adhesion promoter layer over a surface to be masked is shown. In particular, this arrangement may be used where it is critical to provide thin adhesion promotion layers as, for example, over a substrate having large variations in surface topography.

The substrate 12 as, for example, discussed in conjunction with FIG. 2 is provided in an apparatus 50 which provides an extremely fine mist field 56, as shown. The apparatus 50 includes a ultrasonic sprayer 52 coupled to a nozzle 54, as shown. Provided from the nozzle 54 is the fine mist field 56 comprised of the adhesion promoter solution. From this mist field 56, particles of the photoresist are deposited in a somewhat random discontinuous pattern over the substrate 12. Provided, therefore, is a discontinuous layer 20' of adhesion promoter particles 20a in the form of a bed of discrete regions 20a, as shown in conjunction with FIGS. 8 and 9. These discrete regions 20a will have heights $\tau_a$ of typically 10–60Å and, in general, will be non-continuous. In particular, with this arrangement, effectively very thin layers of the adhesion promoter layer may be provided which will improve adhesion of a resist disposed thereover to the substrate.

In general therefore, the solids content of the resin in the resist adhesion promoter is determined by the desired thickness of the adhesion promoter layer. The thickness of the adhesion promoter layer is related to the solids content by the equation $T = (kS^2)/\sqrt{\omega}$ where k is an experimentally determined spinner constant, $\omega$ is the spin speed of the resist spinner used, S is the solids content of the resin containing solution, and T is the thickness of the layer deposited where here for an adhesion promoter the thickness is generally on the order of tens of angstroms, as for example ten to 150Å.

Having described preferred embodiments of the invention, it will now become apparent to one of skill in the art that other embodiments incorporating their concepts may be used. It is felt, therefore, that these embodiments should not be limited to disclosed embodiments, but rather should be limited only by the spirit and scope of the appended claims.

What is claimed is:

1. A structure comprising:
    an adhesion promoter material having a thickness greater than 10Å and less than about 150Å disposed on a base; and
    a layer comprising a resist, said layer having a thickness substantially larger than the thickness of the adhesion promoter material and disposed on said adhesion promoter.

2. The structure, as recited in claim 1, wherein said adhesion promoter material is disposed as a layer of said material having a uniform thickness less than about 100Å and said layer of resist is disposed on said uniform layer of adhesion promoter material.

3. The structure, as recited in claim 2, wherein said layer of material has a thickness in the range of 10–60Å.

4. The structure, as recited in claim 1, wherein said adhesion promoter material is provided on said base as a plurality of small discrete regions having heights less than about 150Å and said layer of resist is disposed on said small discrete regions of adhesion promoter material.

5. The structures, as recited in claim 4, wherein said plurality of small discrete regions have heights in the range of about 10–60Å.

6. The structure, as recited in claim 1, wherein the adhesion promoter material is a resist resin and wherein said layer of resist is the same resist as the resist resin providing the adhesion promoter material.

7. The structure, as recited in claim 1, wherein said adhesion promoter material is ar resist and said layer of resist is a different resist of the adhesion promoter material

* * * * *